United States Patent
Sai et al.

(10) Patent No.: US 8,625,111 B2
(45) Date of Patent: Jan. 7, 2014

(54) OPTICAL FILM THICKNESS METER AND THIN FILM FORMING APPARATUS PROVIDED WITH OPTICAL FILM THICKNESS METER

(75) Inventors: Kyokuyo Sai, Kanagawa (JP); Yohei Hinata, Kanagawa (JP); Yoshiyuki Otaki, Kanagawa (JP); Yousong Jiang, Kanagawa (JP)

(73) Assignee: Shincron Co., Ltd., Yokohama-Shi (JP)

( * ) Notice: Subject to any disclaimer, the term of this patent is extended or adjusted under 35 U.S.C. 154(b) by 0 days.

(21) Appl. No.: 13/381,032

(22) PCT Filed: Jun. 29, 2010

(86) PCT No.: PCT/JP2010/061041
§ 371 (c)(1),
(2), (4) Date: Dec. 27, 2011

(87) PCT Pub. No.: WO2011/001968
PCT Pub. Date: Jan. 6, 2011

(65) Prior Publication Data
US 2012/0105872 A1 May 3, 2012

(30) Foreign Application Priority Data
Jul. 3, 2009 (JP) .................................. 2009-158798

(51) Int. Cl.
*G01B 11/28* (2006.01)
(52) U.S. Cl.
USPC ............................................ 356/630; 356/625
(58) Field of Classification Search
USPC ................ 356/625–632, 504, 503, 485, 492; 250/559.27, 559.28, 559.4, 559.19
See application file for complete search history.

(56) References Cited

U.S. PATENT DOCUMENTS

| 7,304,744 B1 | 12/2007 | Hatanaka et al. |
| 2004/0026240 A1 | 2/2004 | Shidoji et al. |
| 2006/0187444 A1 | 8/2006 | Tsuchimichi et al. |

FOREIGN PATENT DOCUMENTS

| JP | 54-91263 A | 7/1979 |
| JP | 56-44802 A | 4/1981 |
| JP | 59-72010 | 4/1984 |
| JP | 6-11442 A | 1/1994 |
| JP | 2003-121119 A | 4/2003 |
| JP | 2004-219108 | 8/2004 |

(Continued)

OTHER PUBLICATIONS

International Search Report dated Aug. 24, 2010 in PCT application PCT/JP2010/061041.

(Continued)

*Primary Examiner* — Tri T Ton
(74) *Attorney, Agent, or Firm* — Novak Druce Connolly Bove + Quigg LLP

(57) ABSTRACT

An optical film thickness meter capable of measuring an optical film thickness and spectroscopic characteristics highly accurately, and a thin film forming apparatus with the optical film thickness meter are provided. The optical film thickness meter includes a light projector, a light receiver, a monochromator, and a reflection mirror having a reflection surface substantially perpendicularly to the optical axis of measurement light on the side opposite to an actual substrate. The actual substrate is disposed having a predetermined angle to the optical axis. The measurement light passes through the actual substrate twice, whereby a change in transmissivity can be increased, and control accuracy of thickness measurement is improved. Measurement errors caused by a difference in transmission positions is prevented. Since the measurement light which has not passed through the measurement substrate twice is not detected by the light receiver, the optical film thickness and spectroscopic characteristics is measured highly accurately.

11 Claims, 10 Drawing Sheets

(56) References Cited

FOREIGN PATENT DOCUMENTS

| | | |
|---|---|---|
| JP | 2005-301032 A | 10/2005 |
| JP | 2006-45673 A | 2/2006 |
| JP | 2006-330485 A | 12/2006 |
| JP | 2007-199084 A | 8/2007 |
| WO | 02/063064 A | 8/2002 |

OTHER PUBLICATIONS

International Preliminary Report on Patentability dated Feb. 14, 2012 in PCT application PCT/JP2010/061041.
Office action dated Apr. 19, 2011 in corresponding Japanese Patent Application 2009-158798.
Taiwanese Office Action notified on Sep. 18, 2012.
Korean Office Action of Korean Patent Application No. 10-2012-7002789, issued on Apr. 30, 2013.

FIG. 2

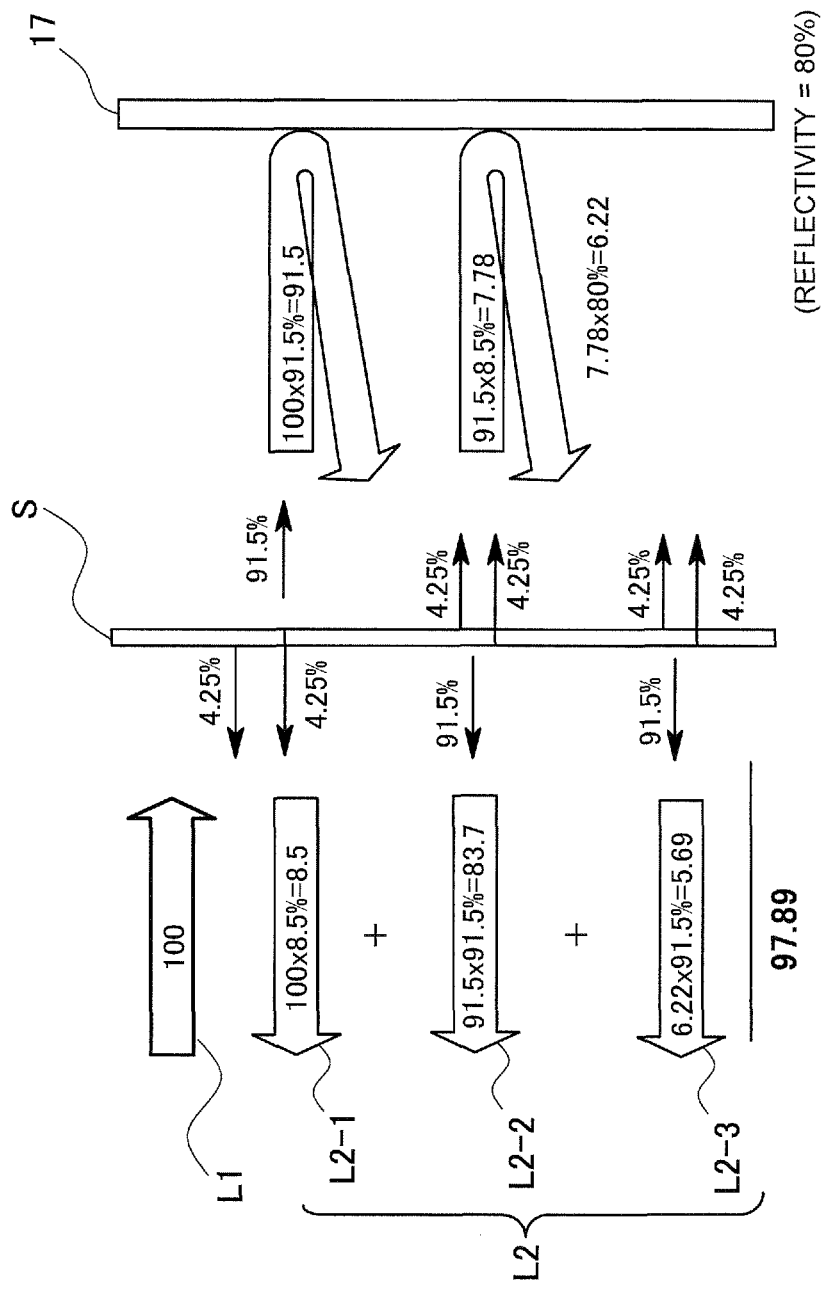

OPTICAL FILM THICKNESS METER AND THIN FILM FORMING APPARATUS PROVIDED WITH OPTICAL FILM THICKNESS METER

TECHNICAL FIELD

The present invention relates to an optical film thickness meter and a thin film forming apparatus provided with the optical film thickness meter and particularly to an optical film thickness meter, which can measure film thickness with high accuracy and a thin film thickness forming apparatus provided with the optical film thickness meter.

BACKGROUND ART

For improvement of control accuracy of optical devices, improvement of accuracy of a film thickness of an optical thin film is in demand. For the highly accurate film thickness control of the optical thin film, measurement is indispensable, and various types of film thickness measurement methods and film thickness meters used for the film thickness control have been proposed. It is preferable that an optical film thickness meter excellent in responsiveness and the like is used for the film thickness measurement. The film thickness here means the film thickness of an optical thin film and has a value depending on the physical film thickness and refraction index.

The optical film thickness meter can be roughly divided into a reflection type and a transmission type. The reflection type is a technology for measuring the film thickness by using a phenomenon of interference caused by generation of a phase difference due to a difference between a path of a light beam reflected on the surface of the optical thin film and a path of a light beam reflected on an interface between a substrate and the optical film, and since reflectance as the entire light beam cyclically changes with respect to the film thickness, this technology is often used if the number of formed films is small or if a relative measurement can be used and has nonconformity in which use applications are relatively limited.

On the other hand, the transmission type is, as illustrated in FIG. 9, a technology in which light emitted from a projector 11 is reflected on a mirror 105 disposed in a mirror box 107 so that the light beam transmitted through the optical thin film is measured, and both the film thickness and spectroscopic characteristics can be acquired from the transmissivity of the light amount. Since this technology is hardly susceptible to a change in the light amount caused by a change in an angle of an actual substrate S, it has an advantage that measurement can be performed with high accuracy.

However, since a substrate for a monitor is used and the substrate for a monitor is arranged at a position different from a position of the actual substrate, a film-thickness difference is present between the substrate for a monitor and the actual substrate, and an experience and knowledge of a staff in charge of film formation are needed for correcting the film-thickness difference, which results in an instability factor in a film forming process and also nonconformity of occurrence of a film thickness control error.

Also, the prior-art optical film thickness meter is mounted on a thin film forming apparatus 3 as illustrated in FIG. 9, and it is difficult to improve measurement accuracy for a film with low refraction index. For example, $SiO_2$ often used as a deposition material has a small refraction index difference from monitor glass, and particularly in a transmission photometric system, a change amount in light amount in the in-situ measurement is small and control is difficult, which are disadvantageous. That is, if the change amount in light amount is small, control is forced to be executed on the basis of a limited change amount, and improvement of accuracy is made difficult.

In order to solve the above problems, a technology in which a light beam (outgoing light) having passed through a measurement substrate is reflected by a corner cube prism and the light beam (reflection light) having passed through the measurement substrate again is measured so as to measure the film thickness and the like is proposed (See Patent Document 1, for example).

Patent Document 1: Japanese Patent Laid-Open No. 2006-45673

DISCLOSURE OF INVENTION

Problem to be Solved by the Invention

However, with the technology described in Patent Document 1, since the light (outgoing light) having passed through the measurement substrate is reflected by the corner cube prism, transmission positions of the outgoing light and the reflection light are different from each other in the measurement substrate, and due to the difference in a portion for transmission measurement, there is nonconformity that a measurement error occurs by micro thin film distribution. Also with this technology, it is necessary to form a reflection protective film (AR film) so that all the reflection light can be used for measurement, and unless the AR film is formed on each surface, a multiple reflection portion between the substrate and the corner cube prism is also measured, and accurate measurement cannot be made, which is nonconformity.

An object of the present invention is to provide an optical film thickness meter, which can measure an actual substrate and minimizes an error of a measurement position and a thin film forming apparatus provided with the optical film thickness meter. Also, another object of the present invention is to provide an optical film thickness meter capable of measurement of optical film thickness and spectroscopic characteristics with high accuracy without requiring an AR film for measurement and a thin film forming apparatus provided with the optical film thickness meter.

Means for Solving Problem

According to an optical film thickness meter according to the present invention, the above problems are solved by an optical film thickness meter which measures an optical film thickness by allowing measurement light to pass through an actual substrate, provided with light projecting means which emits outgoing light as the measurement light toward the actual substrate; a reflection mirror which reflects the outgoing light at a position on the side opposite to the light projecting means relative to the actual substrate; light receiving means which receives the measurement light which has passed through the actual substrate, been reflected by the reflection mirror and passed through the actual substrate; and light detecting means which detects the measurement light received by the light receiving means, in which the actual substrate is disposed with inclination with respect to an optical system comprised of the light projecting means and the reflection mirror.

As described above, since the optical film thickness meter makes measurements by using measurement light which has passed through the actual substrate, been reflected by the reflection mirror and passed through the actual substrate, the measurement light (outgoing light and reflection light) passes through the actual substrate twice, whereby a change amount of transmissivity (light amount) can be increased, and control accuracy of the film thickness measurement can be improved.

Also, since the actual substrate is disposed with inclination with respect to the optical system comprised of the light projecting means and the reflection mirror, only the measurement light reflected by the reflection mirror passes through the actual substrate, and the reflection light, which is generated by the reflection and is disadvantageous for measurement can be excluded.

In more detail the actual substrate is disposed with a predetermined angle with respect to the optical axis of the measurement light at a position between the reflection mirror and the light projecting means.

The outgoing light and the reflection light reflected by the reflection mirror, which are the measurement lights, pass through substantially the same spot on the actual substrate, and thus, the outgoing light and the reflection light, which are the measurement lights before and after the reflection by the reflection mirror, can pass the same spot on the actual substrate, respectively, and occurrence of a measurement error caused by a difference in the transmission positions can be prevented.

Also, the reflection mirror preferably has a reflection surface formed substantially in the perpendicular direction to the optical axis of the measurement light. As a result, the reflection mirror can reflect the measurement light incident from the light projecting means and having passed through the actual substrate without a loss so that the light passes through the actual substrate through the same path as the incident path again.

The reflection mirror is preferably disposed so that an angle formed by a perpendicular line to the reflection surface of the reflection mirror and an optical axis of the measurement light is within a range of $-5.0$ to $+5.0°$.

In this case, since the light amount is ensured to such a degree that the measurement accuracy is not affected by loss of the light amount, a certain degree of freedom can be ensured for a mounting position of the reflection mirror.

Also, the inclination with respect to the optical system formed of the light projecting means and the reflection mirror of the actual substrate is preferably about $4.5°$ or more. In this case, since light not having passed through the actual substrate through the predetermined path (unnecessary reflection light) is not detected by the light detecting means, only the transmitted light of the substrate can be accurately measured.

Also, it is preferable that the actual substrate moves at a predetermined speed, and the reflection mirror is disposed in a fixed manner at a given position with respect to the actual substrate. By fixing the reflection mirror as above, the optical system is made stable.

Also, according to the thin film forming apparatus provided with the optical film thickness meter of the present invention, the above problems are solved by a thin film forming apparatus provided with a dome-shaped substrate holder which holds the actual substrate within a vacuum container and is rotatable; a correcting plate disposed in a fixed manner on the vacuum container side at a position between deposition means which vaporizes a deposition material and the substrate holder; and an optical film thickness meter which measures the optical film thickness by allowing measurement light to pass through the actual substrate in a state in which the actual substrate is mounted on the substrate holder, in which the optical film thickness meter is provided with light projecting means which emits outgoing light as the measurement light toward the actual substrate; a reflection mirror which reflects the outgoing light at a position on the side opposite to the light projecting means relative to the actual substrate; light receiving means which receives the measurement light which has passed through the actual substrate, been reflected by the reflection mirror and passed through the actual substrate; and light detecting means which detects the measurement light received by the light receiving means, in which the actual substrate is disposed with inclination with respect to an optical system comprised of the light projecting means and the reflection mirror.

As described above, according to the present invention, a thin film forming apparatus which can manufacture a substrate (optical product) for which film thickness control of an actual substrate has been sufficiently executed by the optical film thickness meter can be provided.

The reflection mirror is preferably disposed on the correcting plate and can reflect the measurement light by the reflection mirror stably in the fixed state. Also, with the fixed correcting plate, an influence of stray light from a deposition source or plasma discharge is made difficult to be given.

According to the thin film forming apparatus of the present invention, the above problems are solved by a thin film forming apparatus provided with a substantially cylindrical substrate holder which supports the actual substrate within the vacuum container and is rotatable; sputtering means disposed outside the substrate holder; and an optical film thickness meter which measures the optical film thickness by allowing the measurement light to pass through the actual substrate in a state in which the actual substrate is mounted on the substrate holder, in which the optical film thickness meter is provided with light projecting means which emits outgoing light as the measurement light toward the actual substrate; a reflection mirror which reflects the outgoing light at a position on the side opposite to the light projecting means relative to the actual substrate; light receiving means which receives the measurement light having passed through the actual substrate, having been reflected by the reflection mirror and having passed through the actual substrate; and light detecting means which detects the measurement light received by the light receiving means, in which the actual substrate is disposed with inclination with respect to an optical system comprised of the light projecting means and the reflection mirror. In this case, the reflection mirror is preferably disposed in the substrate holder.

As described above, since the reflection mirror is arranged in the substrate holder, the reflection mirror is difficult to be stained and is hardly susceptible to the influence of stray light from the plasma discharge in sputtering.

Effect of the Invention

According to the optical film thickness meter and the thin film forming apparatus according to the present invention, since the actual substrate itself can be measured, unlike measurement with a monitor substrate, a measurement error or the like hardly occurs. Also, the measurement light (outgoing light and reflection light) passes the actual substrate twice, whereby the change amount of the transmissivity (light amount) can be increased, and control accuracy of the film thickness measurement can be improved. Also, since the actual substrate is disposed with a predetermined angle with respect to the optical axis of the measurement light, only the measurement light reflected by the reflection mirror passes through the actual substrate, and a portion of a reflection light of multiple reflection generated between the reflection mirror and the actual substrate can be removed.

BRIEF DESCRIPTION OF DRAWINGS

FIG. 2 is a configuration explanatory diagram of a thin film forming apparatus provided with a dome-shaped holder seen from the side;

FIGS. 4A and 4B are explanatory diagrams illustrating inclination of a substrate and a rate change of the measurement light;

EXPLANATIONS OF LETTERS OR NUMERALS

Figure 1:
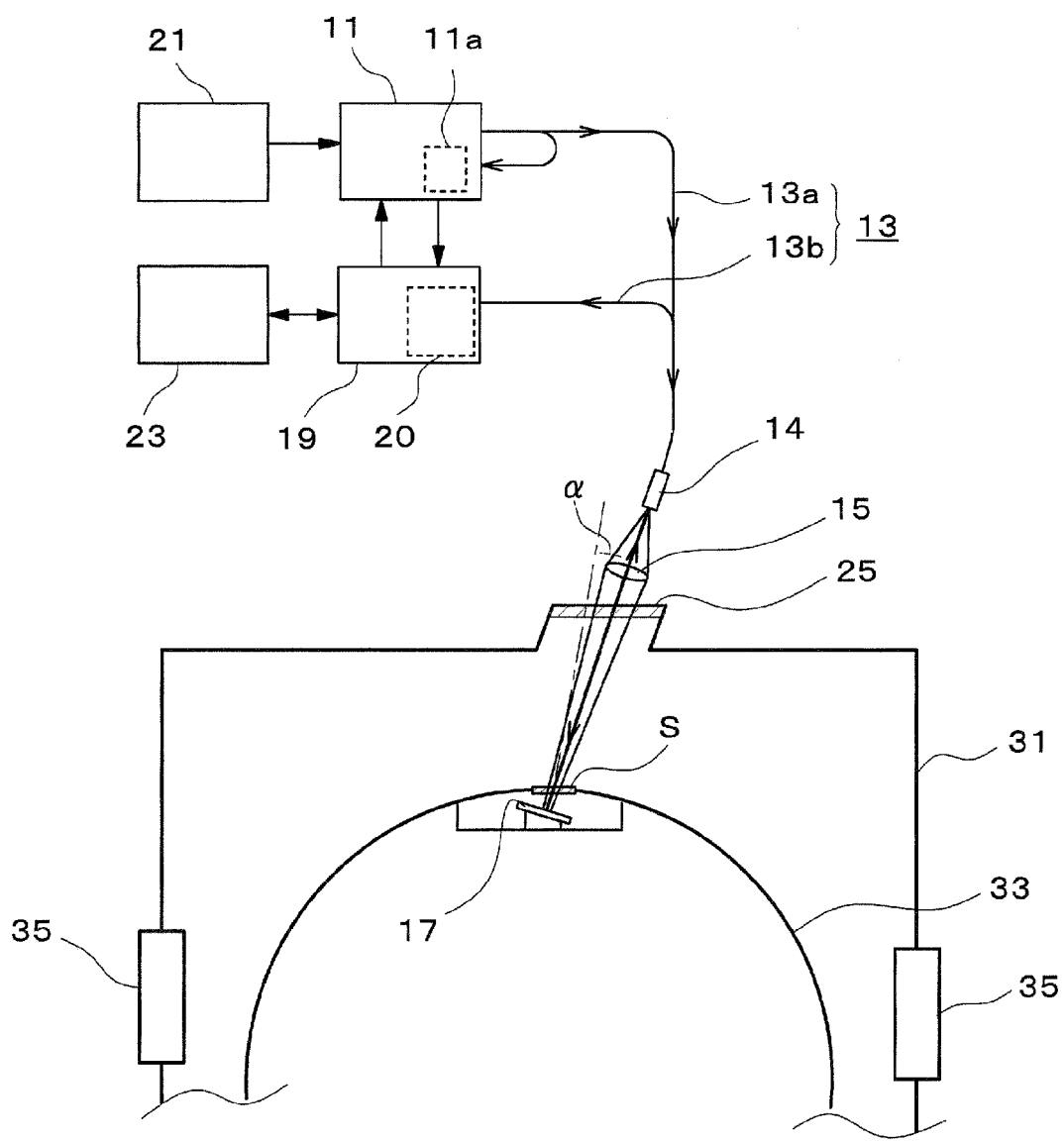
FIG. 1 is a configuration explanatory diagram illustrating a thin film forming apparatus provided with a rotary-drum type holder seen from above.

S actual substrate (measurement substrate)
F optical filter
L1 outgoing light
L2 (L2-1, L2-2, L2-3) reflection light
1, 2, 3 thin film forming apparatus
11 light projector
11a Ref circuit
13 optical fiber
13a optical fiber on the outgoing light side
13b optical fiber on the reflection light side
14 optical fiber end portion
15 spherical achromatic lens
17 reflection mirror
19 light receiver
20 monochromator
21 stabilized power supply for light source
23 computer (PC for calculation)
25 measurement window
31, 41, 101 vacuum container
33 rotary-drum holder
35 sputtering means
43, 103 rotary holder
45 deposition means
47 correcting plate
105 mirror
107 mirror box

BEST MODE(S) FOR CARRYING OUT THE INVENTION

An embodiment of the present invention will be described below by referring to the attached drawings. Members, arrangement and the like described below are one example which embodies the invention and do not limit the present invention, and it is needless to say that various alterations are possible along the gist of the present invention.

Figure 2:
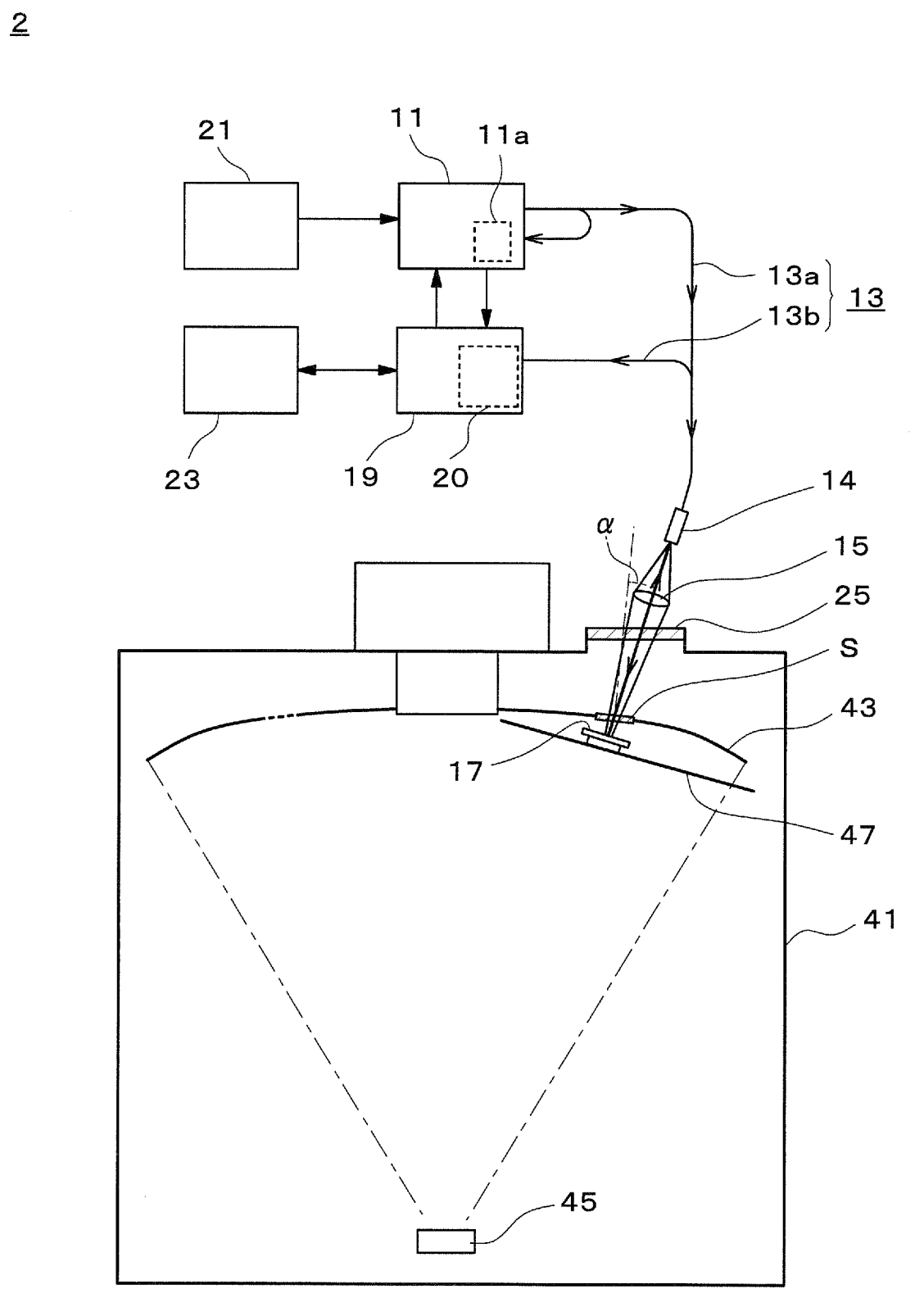

FIGS. 1 and 2 illustrate an optical film thickness meter and a thin film forming apparatus according to the present invention, in which FIG. 1 is a configuration explanatory diagram illustrating a thin film forming apparatus provided with a rotary-drum type holder seen from above, and FIG. 2 is a configuration explanatory diagram of a thin film forming apparatus provided with a dome-shaped holder seen from the side.

Figure 3:
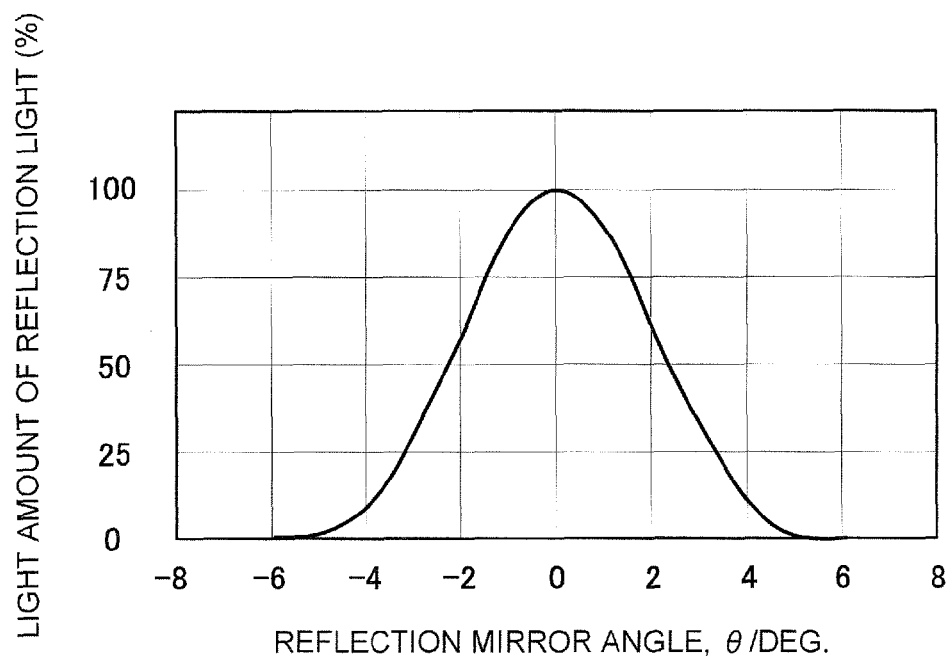
FIG. 3 is a graph illustrating a relationship between a reflection mirror angle to an optical axis and measurement light intensity.
Figure 4B:
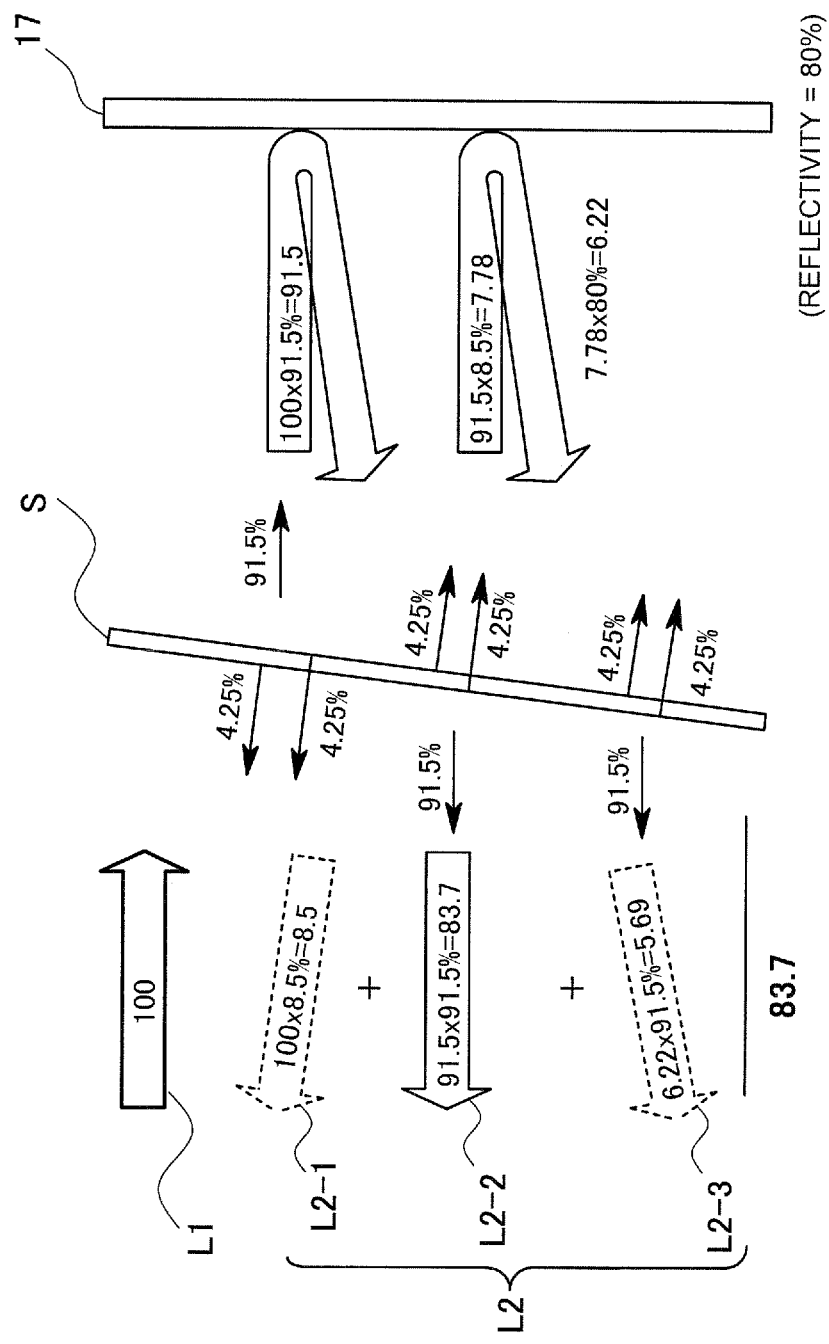
Figure 5A:
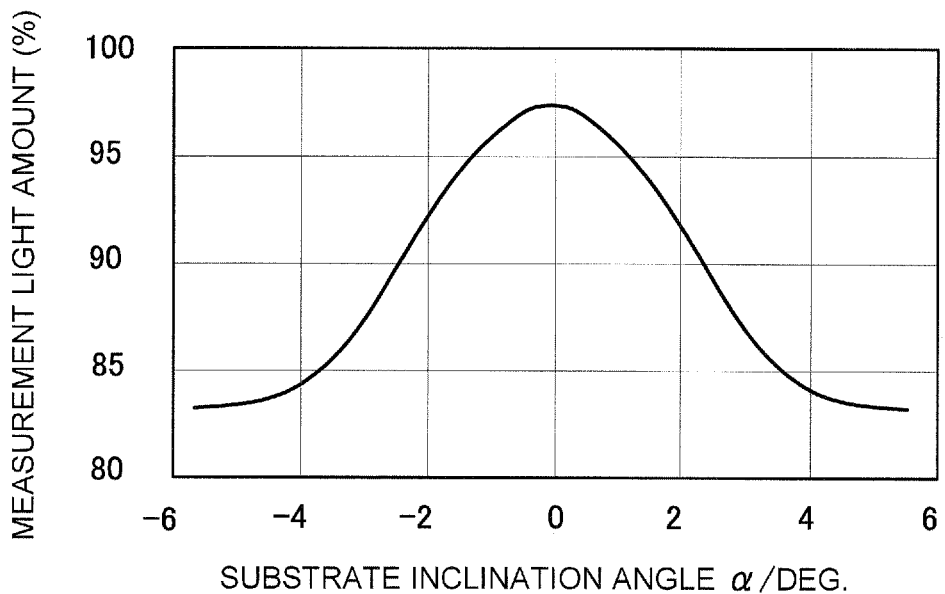
FIG. 5 are graphs illustrating a relationship between a substrate angle and the measurement light intensity.
Figure 5B:
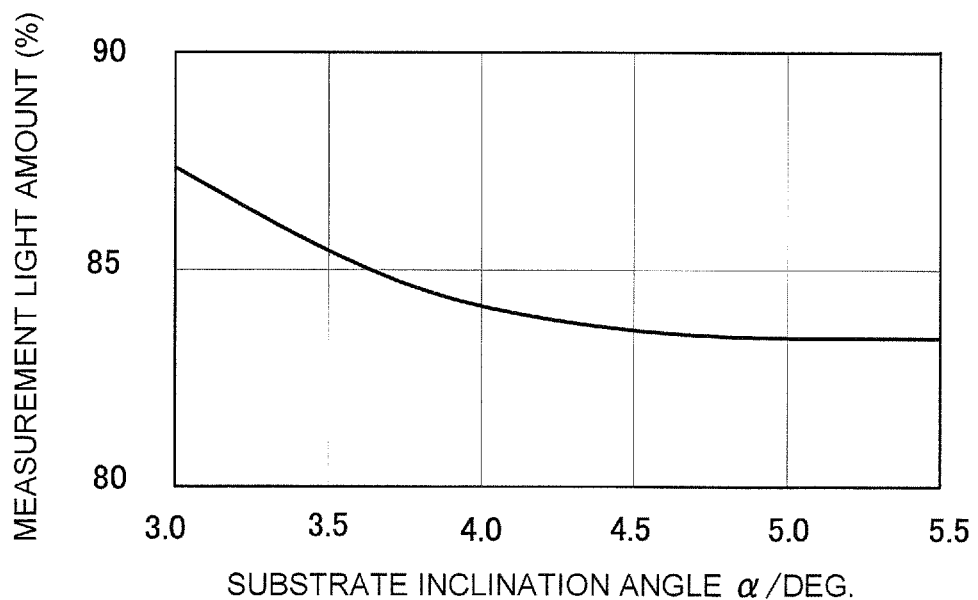
Figure 6:
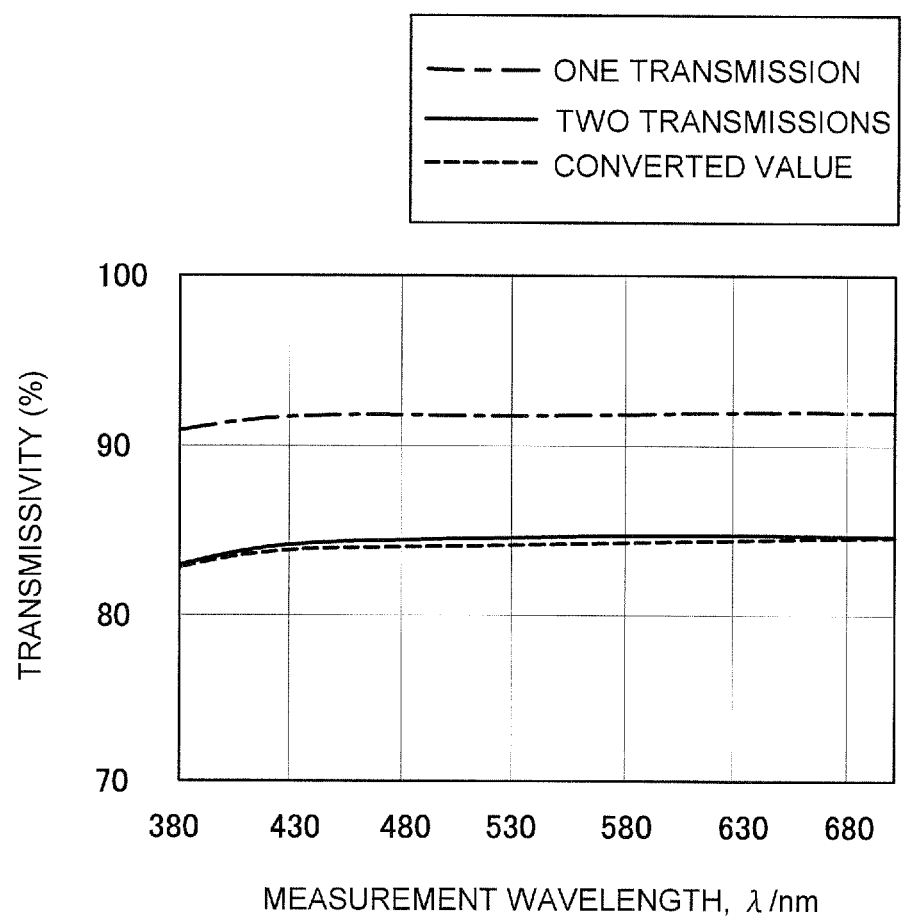
FIG. 6 is a graph illustrating a transmissivity measurement result of a BK-7 substrate.
Figure 7:
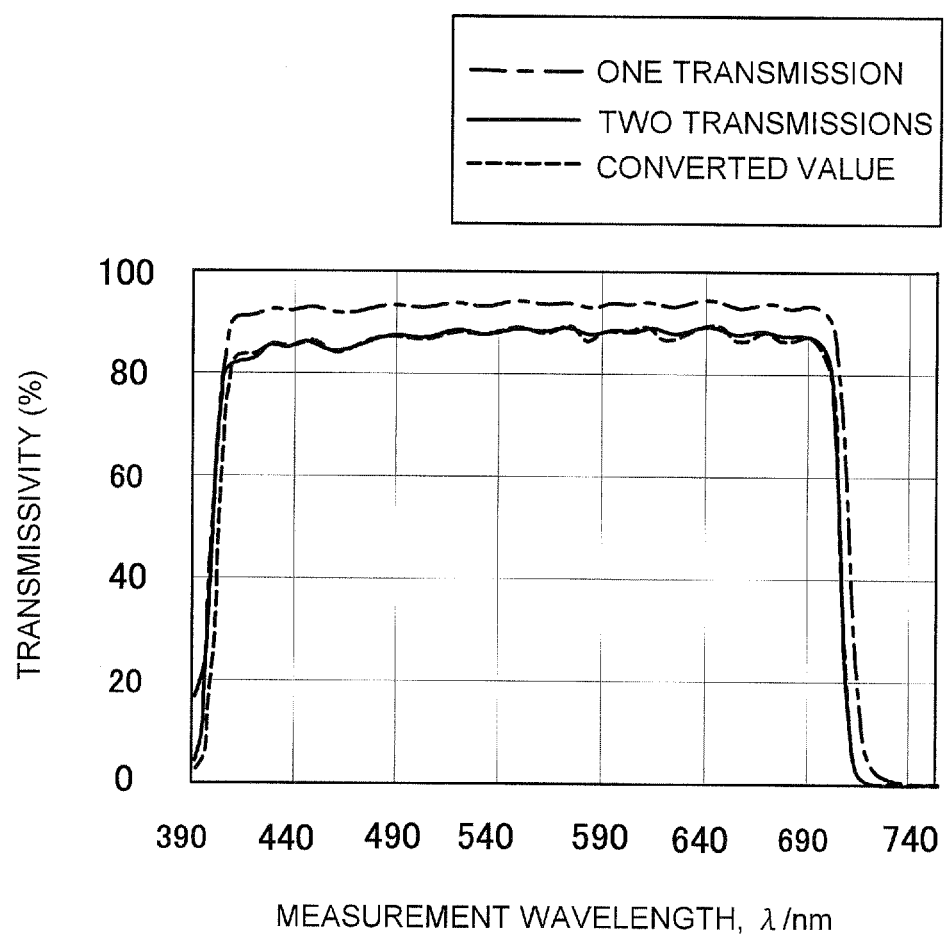
FIG. 7 is a graph illustrating the transmissivity measurement result of an IR cut filter.
Figure 8:
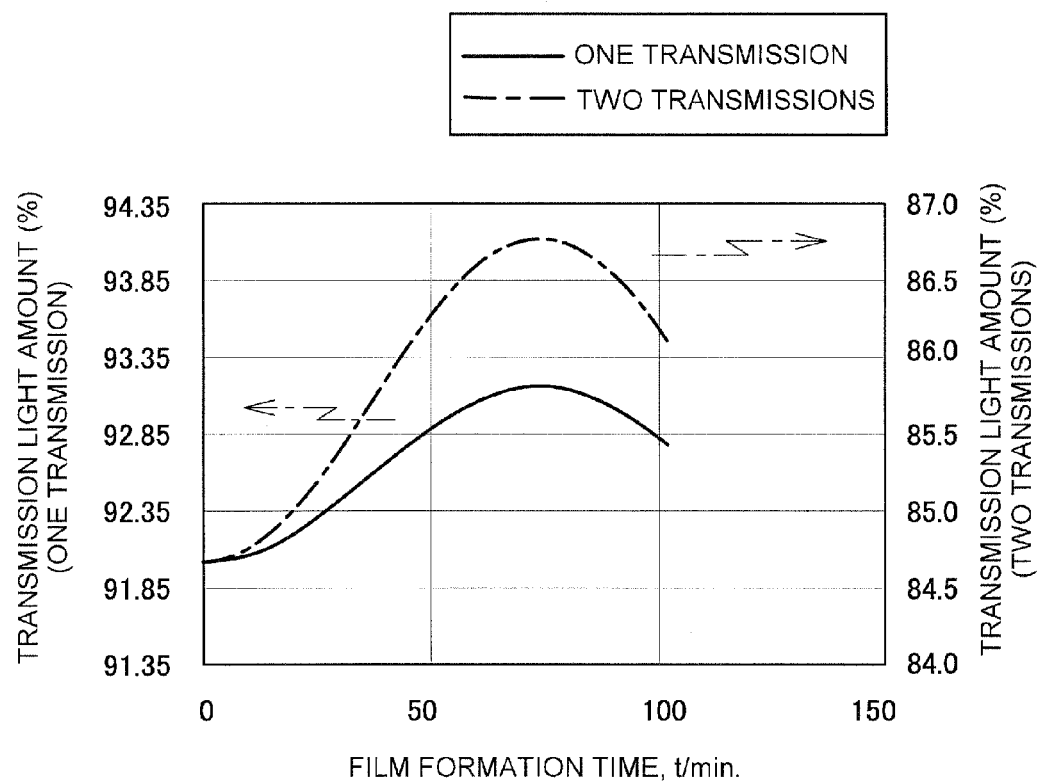
FIG. 8 is a graph of a calculation result of a light amount change in an optical film thickness at a wavelength of 520 nm by time elapse in the case of formation of a $SiO_2$ single-layer film.
Figure 9:
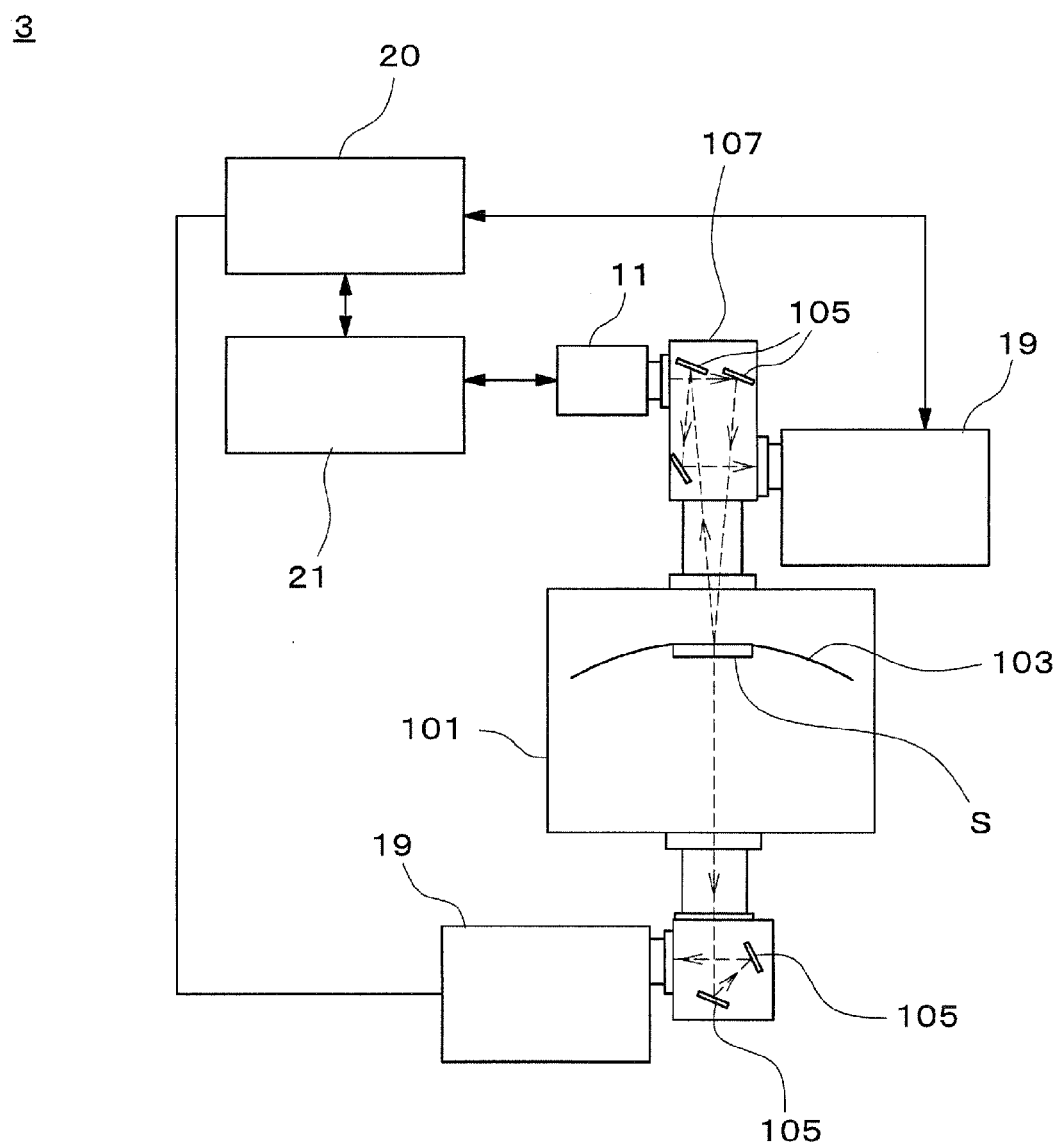
FIG. 9 is a configuration explanatory diagram of a thin film forming apparatus provided with a prior-art transmission-type optical film thickness meter.

Also, FIGS. 3 to 8 relate to an optical film thickness meter according to the present invention, in which FIG. 3 is a graph illustrating a relationship between a reflection mirror angle to an optical axis and measurement light intensity, FIGS. 4A and 4B are an explanatory diagram illustrating inclination of a substrate and a rate change of the measurement light, FIG. 5 is a graph illustrating a relationship between a substrate angle and the measurement light intensity, FIG. 6 is a graph illustrating a transmissivity measurement result of a BK-7 substrate, FIG. 7 is a graph illustrating the transmissivity measurement result of an IR cut filter, and FIG. 8 is a graph of a calculation result of a light amount change in an optical film thickness at a wavelength of 520 nm by time elapse in the case of formation of a $SiO_2$ single-layer film.

The optical film thickness meter according to the present invention does not measure a monitor substrate dedicated for measurement but measures the film thickness of an actual substrate (product) S as a measurement substrate and includes, as illustrated in FIGS. 1 and 2, a light projector 11 as a light source or light projecting means, an optical fiber 13 (13a and 13b) as light guiding means, a spherical achromatic lens 15, a reflection mirror 17, and a light receiver 19 as light receiving means. Also, a voltage is applied to the light projector 11 through a stabilized power supply 21 for a light source, and the light receiver 19 is connected to a computer (PC for calculation) 23.

As illustrated in FIG. 4, in this description, measurement light before being reflected by a reflection mirror 17 is described as outgoing light L1 and the measurement light after being reflected as reflection light L2 (L2-1, L2-2, L2-3) separately.

The light projector 11 is a device which outputs the outgoing light L1 used for measurement and incorporates a Ref circuit 11a, and to the light projector 11, electric power is supplied from the stabilized power supply 21 for a light source and the light projector 11 is constituted so as to emit the measurement light having an arbitrary wavelength to an optical fiber 13a on the outgoing light side.

The light receiver 19 is a device into which light having passed through an actual substrate S, which is a measurement substrate, by the outgoing light L1 is reflected by the reflection mirror 17 and the reflection light L2 which passed through the actual substrate S again is inputted through an optical fiber 13b on the reflection light side.

The light receiver 19 is provided with a monochromator 20 as light detecting means and is capable of measurement of a wavelength or transmissivity of the measurement light and is connected to a computer (PC for calculation) 23 which calculates and displays a film thickness and optical characteristics of an optical thin film on the basis of an analysis result by the monochromator 20.

The optical fiber 13 is comprised of a two-branch bundle fiber formed of the optical fiber 13a on the outgoing light side and the optical fiber 13b on the reflection light side and is collected in a two-branch flexible tube made of stainless steel. The optical fiber 13a on the outgoing light side has one end portion side connected to the light projector 11, while the optical fiber 13b on the reflection light side has one end portion side connected to the light receiver 19. An optical fiber end portion 14 of each of the optical fiber 13a on the outgoing light side and the optical fiber 13b on the reflection light side are collected into one bundle and disposed having its optical axis oriented toward the spherical achromatic lens 15 and the actual substrate S, which is a measurement substrate. The outgoing light L1 emitted from the optical fiber end portion 14 has a circular section having a diameter of 5 to 6 mm.

The spherical achromatic lens 15 is a lens, which removes aberration by the wavelength (chromatic aberration) and spherical aberration and can improve measurement accuracy and is disposed between the optical fiber end portion 14 and a measurement window 25 formed in the thin film forming apparatuses 1 and 2.

The reflection mirror 17 is disposed on the back side of the actual substrate S and reflects the outgoing light L1 from the light projector 11 having passed through the actual substrate S. For the reflection mirror 17, a mirror coated with Al film or Ag film, a mirror over-coated with $MgF_2$ or SiO on the Al film or Ag film, or a mirror over-coated with other dielectric films can be used. The size of the reflection surface is arbitrary, but it is preferable that the size is approximately equal to the size of the actual substrate S, which is several centimeters. The reflection surface of the reflection mirror 17 has reflectance of approximately 80%. The reflection mirror 17 is disposed substantially perpendicular (at a right angle) to the optical axis of the outgoing light L1 emitted to the actual substrate S, and thus, the reflected outgoing light L1 becomes the reflection light L2, and the reflection light L2 passes through the actual substrate S along the same path as the optical axis of the outgoing light L1.

The spherical achromatic lens 15, the actual substrate S, and the reflection mirror 17 are disposed along the optical axis of the measurement light from the optical fiber end portion 14.

For the actual substrate S, a member formed of a material such as glass is preferable. In this embodiment, a plate-shaped member is used for the actual substrate S, but the shape of the actual substrate S is not limited to such a plate shape. Also, other shapes on the surface of which a thin film can be formed such as a lens shape, a cylindrical shape, a ring shape or the like, for example, can be used. Here, the glass material is a material formed of silicon dioxide ($SiO_2$), and specifically, quartz glass, soda-lime glass, borosilicate glass and the like can be cited. The actual substrate S in this embodiment is supposed to include an optical filter F.

Also, the material of the actual substrate S is not limited to glass but may be a plastic resin. Examples of the plastic resin include a resin material selected from a group comprising of polycarbonate, polyethylene terephthalate, polybutylene terephthalate, acrylonitrile-butadiene-styrene copolymer, nylon, polycarbonate-polyethylene terephthalate copolymer, polycarbonate-polybutylene terephthalate copolymer, acryl, polystyrene, polyethylene, and polypropylene or a mixture of these materials and a glass fiber and/or a carbon fiber and the like.

Here, a path along which the measurement light (the outgoing light L1 and the reflection light L2) radiated from the light projector 11 is inputted into the light receiver 19 will be described.

The outgoing light L1, which is the measurement light outputted from the light projector 11, is radiated from the optical fiber end portion 14 to the spherical achromatic lens 15 through the optical fiber 13a on the light projection side, passes through the measurement window 25 formed in the thin film forming apparatuses 1 and 2 and is radiated to the actual substrate S.

The outgoing light L1 radiated to the actual substrate S passes through the actual substrate S, is reflected by the reflection mirror 17 disposed on the back side of the actual substrate S and becomes the reflection light L2. The reflection light L2 reflected by the reflection mirror 17 passes through the actual substrate S, the measurement window 25, and the spherical achromatic lens 15 again and reaches the optical fiber end portion 14. Then, only the measurement light from the actual substrate S side (the reflection light L2) passes through the optical fiber 13b on the reflection light side and is led to the light receiver 19.

As will be described later, the actual substrate S is disposed so as to have an inclination angle with respect to the optical axis of the measurement light.

Subsequently, a mounted state of the optical film thickness meter on the thin film forming apparatuses 1 and 2 will be described.

The thin film forming apparatus 1 illustrated in FIG. 1 is a sputtering (magnetron sputtering) device provided with a rotary-drum holder 33 and includes at least a vacuum container 31, the rotary-drum holder 33 as a substrate holder on which the actual substrate S is mounted, sputtering means 35 provided opposite to each other outside the rotary-drum holder 33, and an unshown sputter gas supply means.

The vacuum container 31 is made of stainless steel usually used in a known thin film forming apparatus and is a hollow body having a substantially rectangular solid shape. Also, on the side face side of the vacuum container 31, that is, on the radial direction side of the rotary-drum holder 33 of the vacuum container 31, the measurement window 25 is formed.

The rotary-drum holder 33 is formed substantially cylindrically and is arranged with the rotary shaft directed in the vertical direction of the vacuum container 31. The rotary-drum holder 33 has a function as holding means for the actual substrate S, and the actual substrates S are mounted in a juxtaposed manner on the outer peripheral face of the rotary-drum holder 33 through a substrate holder, not shown, or the like.

Since an opening (not shown) having a predetermined size is formed in a portion of the rotary-drum holder 33 where the actual substrate S is mounted, the measurement light having passed through the actual substrate S can enter the inside of the rotary-drum holder 33. The rotary-drum holder 33 may be formed in a hollow prism shape.

The sputtering means 35 is formed of a pair of targets, a pair of magnetron sputter electrodes, which hold the targets, and a power supply device (none of them is shown). The target gas has a plate shape and is installed such that the longitudinal direction of the target is parallel with a rotation axis of the rotary-drum holder 33.

In the periphery of the sputtering means 35, the sputter gas supply means, which supplies a sputter gas such as argon, is provided. If an AC voltage is applied from the power supply to the magnetron sputter electrode in a state in which the periphery of the target becomes an inactive gas atmosphere, a part of the sputter gas in the periphery of the target emits electrons and is ionized. This ion is accelerated and collides against the target so that atoms and particles (if the target is niobium, niobium atoms or niobium particles) on the surface of the target are knocked out. The niobium atoms and niobium particles are film material substances (deposition substances), which is a material of the thin film, and adheres to the surface of the actual substrate S, and the thin film is formed.

In the thin film forming apparatus 1, if the rotary-drum holder 33 is rotated, the actual substrate S held on the outer peripheral surface of the rotary-drum holder 33 revolves and repeatedly moves through two positions facing the sputtering means 35. Then, since the actual substrate S revolves as above, sputtering treatment by the sputtering means 35 is sequentially performed repeatedly, and the thin film is formed on the surface of the actual substrate S.

It may be so configured that plasma generating means is mounted on the thin film forming apparatus 1 to conduct a pretreatment process of applying plasma treatment to the surface of the actual substrate S before the thin film is formed or a post-treatment process of applying the plasma treatment to the surface of the actual substrate S after the thin film is formed, at the same time as formation of the thin film. It is needless to say that another film forming means may be used instead of the sputtering means 35 in the configuration.

In the thin film forming apparatus 1, the optical film thickness meter according to the present invention is configured such that the outgoing light L1 is radiated from the measurement window 25 formed in a part of the vacuum container 31 toward the actual substrate S and the reflection light L2, which was the outgoing light L1 having passed the actual substrate S, reflected by the reflection mirror 17 installed on the back side of the actual substrate S can pass through the actual substrate S again.

Specifically, the other end portion of the optical fiber 13 and the spherical achromatic lens 15 connected to the light projector 11 and the light receiver 19 are disposed outside the vacuum container 31, and the reflection mirror 17 is fixed to the back side of the actual substrate S and also at a position inside the rotary-drum holder 33. Since the opening portion is formed in the rotary-drum holder 33 at the position where the actual substrate S is mounted, the outgoing light L1 having passed through the actual substrate S can be made to pass through the opening portion of the rotary-drum holder 33 and to be reflected by the reflection mirror 17 disposed inside thereof.

As described above, by mounting the optical film thickness meter, the optical film thickness and optical characteristics and the like of the actual substrate S mounted on the rotary-drum holder 33 can be measured even during film formation. Specifically, the rotary-drum holder 33 is measured for the film thickness or the like at a predetermined position where the measurement portion of the actual substrate S is over-lapped with the optical axis of the measurement light. The actual substrate S is disposed so as to have an inclination angle with respect to the optical axis of the measurement light.

In the thin film forming apparatus 1, the reflection mirror 17 is fixed to the back side of the actual substrate S and also at a position inside the rotary-drum holder 33. Thus, the reflection mirror 17 is hardly susceptible to stains and an influence of stray light from plasma discharge during sputtering, which is advantageous.

Also, the reflection mirror 17 may be mounted on a plurality of the actual substrates S. That s, if the actual substrate S and the reflection mirror 17 are assembled in a pair, a plurality of measurements can be made for each of the actual substrates S for the film thickness and optical characteristics of the actual substrate S at a predetermined position corresponding to the position of the outgoing light L1. By configuring as above, by rotating the rotary-drum holder 33 so as to arrange the actual substrate S at a predetermined position, the plurality of actual substrates S in a state mounted on the rotary-drum holder 33 can be measured for the optical film thickness by allowing the measurement light to sequentially pass therethrough. Thus, the film thicknesses of the plurality of actual substrates S can be measured simultaneously, and a thin film forming apparatus capable of measurement of the optical film thickness with higher accuracy can be obtained.

Subsequently, the thin film forming apparatus 2 illustrated in FIG. 2 is a deposition device provided with a rotary holder 43 disposed in a vacuum container 41 and includes at least a dome-shaped rotary holder 43 as a substrate holder on which the actual substrate S is mounted and deposition means 45 provided on the lower side oppositely to the rotary holder 43. Also, in the thin film forming apparatus 2 in this embodiment, a correcting plate 47 is disposed at a position between the rotary holder 43 and the deposition means 45.

The vacuum container 41 is made of stainless steel usually used in a known thin film forming apparatus and is a hollow body having a substantially rectangular solid shape. Also, on the upper side of the rotary holder 43, the measurement window 25 is formed.

The rotary holder 43 is formed substantially in the dome shape and arranged in the vacuum container 41 with the rotary shaft directed in the vertical direction and has a function as substrate holding means, and a plurality of the actual substrates S can be attached to the rotary holder 43 through a mounting jig, not shown. In the portion where the actual substrate S of the rotary holder 43 is mounted, an opening portion having a predetermined size (not shown) is formed.

The deposition means 45 is installed at a position opposite to the rotary holder 43 on the lower side of the vacuum container 41 and includes a deposition substance contained in a melting pot and an electron beam source or a high-frequency coil for heating the deposition substance and the like. It is needless to say that a sputter source formed of a target, an electrode, and a power supply may be used as the deposition means.

The correcting plate 47 is a substantially plate-shaped member, which corrects a difference in the film thickness on the actual substrate S caused by a mounting position of the rotary holder 43 and is fixed in the vicinity of the vacuum container 41. As a result, when a thin film is to be formed on the actual substrate S, by partially preventing accumulation of a vaporized substance vaporized from the deposition means 45 toward the actual substrate S, the film thickness can be corrected. In the thin film forming apparatus 2, the vaporized substance vaporized from the deposition means 45 accumulates on the actual substrate S mounted on the rotary holder 43 so that a film is formed. At this time, by means of the rotation of the rotary holder 43 and the correcting plate 47, a difference in the film thickness by the position of the actual substrate S is corrected.

In the thin film forming apparatus 2, the optical film thickness meter according to the present invention is configured such that the outgoing light L1 is radiated from the measurement window 25 formed in a part of the vacuum container 41 toward the actual substrate S, and the outgoing light Li having passed through the actual substrate S is reflected by the reflection mirror 17 installed on the correcting plate 47 on the lower side of the actual substrate S so as to be made the reflected light L2, which is passed through the actual substrate S again.

Specifically, the optical fiber end portion 14 and the spherical achromatic lens 15 connected to the light projector 11 and the light receiver 19 are disposed outside the vacuum container 41, and the reflection mirror 17 is fixed at a position on the lower side of the actual substrate S and on the upper side of the correcting plate 47. Since the opening portion is formed in the rotary holder 43 at the position where the actual substrate S is mounted, the outgoing light L1 having passed through the actual substrate S can be made to pass through the opening portion in the rotary holder 43 and to be reflected by the reflection mirror 17 disposed on the lower side thereof.

As described above, by mounting the optical film thickness meter, the optical characteristics such as the film thickness of the actual substrate S mounted on the rotary holder 43 can be measured even during the film formation. Specifically, measurement of the film thickness and the like is made with the rotary holder 43 at a predetermined position where the measurement portion of the actual substrate S is overlapped with the optical axis of the measurement light.

The optical film thickness meter is disposed so that the actual substrate S has an inclination angle with respect to the optical axis of the measurement light.

Also, since the reflection mirror 17 is mounted on the actual substrate S side of the correcting plate 47, the actual substrate S disposed on a measurement circumference can be measured in a fixed state, whereby stable measurement can be made.

In the thin film forming apparatus 2, the reflection mirror 17 is mounted on the same side as the actual substrate S relative to the correcting plate 47, and since it is likely that the deposition substance from the deposition means 45 sneaks around and adheres to the reflection surface of the reflection mirror 17, a sneaking-preventive glass can be mounted immediately in front of the reflection mirror 17. Moreover, the sneaking-preventive glass may be surrounded by a cylindrical hood in order to prevent adhesion of the deposition substances to the sneaking-preventive glass.

The sneaking-preventive glass is preferably replaced regularly. Also, the sneaking-preventive glass is more preferably disposed having an angle with respect to the optical axis of the measurement light similarly to the actual substrate S.

Also, in the thin film forming apparatuses 1 and 2, when measurement is to be made by the optical film thickness meter, the actual substrate S needs to be accurately aligned to the measurement position. Thus, both the thin film forming apparatuses 1 and 2 are provided with rotation control means which stops the rotary-drum holder 33 or the rotary holder 43 at a measurement position. As the rotation control means, a known device can be applied and can be configured by including a positional sensor and a motor which can monitor and control a rotational angle all the time, for example.

In the thin film forming apparatuses 1 and 2, the measurement window 25 is also disposed with a predetermined angle with respect to the optical axis of the measurement light. This is because of the same reason as disposition of the actual substrate S with inclination at a certain angle. Thus, light reflected by the glass member of the measurement window 25 can be also prevented from being inputted into the light receiver 19 side.

The optical film thickness meter of the present invention will be described below by referring to FIGS. 3 to 8.

Measurements or calculation examples illustrated below are results in the thin film forming apparatus 1 on which the optical film thickness meter according to the present invention is mounted, but advantages and the like which can be obtained from the measurement results can be also applied to the thin film forming apparatus 2 as they are.

FIG. 3 is a graph illustrating a relationship between a reflection mirror angle θ to the optical axis and the intensity of the measurement light and a measurement result of the reflection mirror angle θ from −6 to +6°.

Here, the reflection mirror angle θ of the reflection mirror 17 is an angle formed by a perpendicular line to the reflection surface of the reflection mirror 17 and the optical axis of the measurement light.

As obvious from FIG. 3, when the angle θ of the reflection mirror 17 is 0°, the light amount of the reflection light becomes the maximum value. In FIG. 3, data converted as the reflectivity of the reflection mirror 17 at 100% is shown.

Also, though the measurement light intensity of the reflection light becomes the maximum when the reflection mirror angle θ is 0°, the measurement light intensity is 82 to 87% or more at the reflection mirror angle θ of ±1.0° with respect to the reflection mirror angle θ=0°, and if the reflection mirror angle θ is ±0.6°, the measurement light intensity is 94 to 96% or more. In FIG. 3, the light amount of the reflection light is a value expressed in a rate of the light amount measured in the reflection mirror 17 (the light amount of the reflection light L2) with respect to the light amount of the outgoing light L1 in percentage.

Also, the allowable reflection mirror angle θ=−5.0 to +5.0° of the reflection mirror 17 is a value changing in accordance with the distance between the reflection mirror 17 and the spherical achromatic lens 15 or the optical fiber end portion 14. That is, if the distance between the reflection mirror 17 and the spherical achromatic lens 15 or the optical fiber end portion 14 becomes longer, the allowable reflection mirror angle θ of the reflection mirror 17 becomes small.

In the thin film forming apparatus 1, the distance between the reflection mirror 17 and the spherical achromatic lens 15 is approximately 60 to 350 mm.

FIG. 4 is an explanatory diagram illustrating inclination of the substrate and a rate change of the measurement light and illustrates the inclination of the actual substrate S, a path of the measurement light (outgoing light and reflection light), and a rate change of the light, in which FIG. 4A illustrates a case of the inclination angle α of the actual substrate S=0° (no inclination), and FIG. 4B illustrates a case of the inclination angle α of the actual substrate S that has a certain value. Here, the inclination angle α of the actual substrate S is an angle formed by a perpendicular line to the film formation surface of the actual substrate S and the optical axis of the measurement light.

The light amounts in FIGS. 4 are indicated with the light amount measured in a state in which the actual substrate S is not mounted as 100%. Also, the reflectivity of the reflection mirror 17 is assumed to be 80%, here.

First, the path of the measurement light with the inclination angle α of the substrate=0° and the rate change of the light illustrated in FIG. 4A will be described.

The light incident from the measurement window 25 of the vacuum container 31 (the outgoing light L1) passes through the actual substrate S. At this time, supposing that the total light amount of the incident light (the outgoing light L1) is "100", the light is reflected on the surfaces on both sides of the actual substrate S by 4.25% each without passing through the substrate (total light amount is 8.5). The light with the light amount of 8.5 is emitted from the measurement window 25 as reflection light L2-1. Therefore, the light amount passing through the actual substrate S becomes 91.5. The transmission light with the light amount of 91.5 is reflected by the reflection mirror 17 disposed on the back side of the actual substrate S. This turned back reflection light passes through the actual substrate S again and similarly, considering the reflectivity of 8.5% in total, the remaining 91.5% passes through the actual substrate S. That is, the light amount of 83.7 (the first transmission light 91.5×second transmissivity of 91.5% by turning back from the reflection mirror 17) is emitted as L2-2 from the measurement window 25. At this time, the reflectivity of the reflection mirror 17 is ignored because 100%-baseline measurement is conducted in a state without the actual substrate S (only reflection of the reflection mirror 17) before measurement of the actual substrate S.

When the turned back reflection light passes through the actual substrate S, if the light amount of 7.78 reflected by the actual substrate S (91.5×8.5%) is reflected by the reflection mirror 17 again, the light amount of 6.22 (7.78×reflection mirror reflectivity of 80%) travels toward the actual substrate S again. This re-reflection light with light amount of 6.22 is also reflected by the actual substrate S by 4.25% each or 8.5% in total, and the light amount of 5.69 (6.22×91.5%) is emitted from the measurement window 25 as L2-3.

That is, the light emitted from the measurement window 25 is L2-1 to 3, in which the reflection light of the actual substrate S is mixed.

That is, the light incident from the measurement window 25 (the outgoing light L1) is roughly divided as follows (since the multiple reflection light of the reflection light L2-4 or more is micro, it is ignored in this model):

(1) Reflection light L2-1: 8.5 (double-sided reflection light by the actual substrate S)

(2) Reflection light L2-2: 83.7 (light passing through the actual substrate S twice by reflection of the reflection mirror 17)

(3) Reflection light L2-3: 5.69 (light passing through the actual substrate S by re-reflection of the reflection mirror 17)

Therefore, among the light incident from the measurement window 25 (the outgoing light L1), the light amount becomes approximately 97.89 (8.5+83.7+5.69) and travels toward the measurement window 25 of the vacuum container 31 as the reflection light L2. It is because all the reflected light beams travel along the same path since the inclination angle of the actual substrate is 0°.

That is, in the case of the inclination angle of the actual substrate S at 0°, approximately 14.19 (8.5+5.69) among the light inputted into the light receiver 19 (the reflection light L2) is the reflection light of the actual substrate S. Therefore, supposing that the inclination angle of the actual substrate S is 0°, the reflection light L2 incident to the light receiver 19 includes the light beam having passed a path other than the desired one by 10% or more, which causes a measurement error.

Subsequently, the path of the measurement light and the rate change of the light if the inclination angle of the substrate has a predetermined value illustrated in FIG. 43 will be described.

Similarly to the above FIG. 4A, transmission and reflection of the outgoing light L1 and the reflection light L2 occurs, but since the actual substrate S is inclined with a predetermined angle, the light of 8.5% reflected on the surface of the actual substrate S is reflected in the direction according to the inclination of the actual substrate S. Therefore, if the inclination angle of the actual substrate S is a predetermined value or more, the light beam reflected on the surface of the actual substrate S does not travel toward the light receiver 19.

Also, in the reflection light L2 reflected by the reflection mirror 17, the light reflected by the actual substrate S is also reflected in the direction according to the inclination of the actual substrate S and does not travel toward the light receiver 19, either.

That is, if the actual substrate S is inclined by a predetermined angle, only the light beam (with the light amount of 83.7) having passed through the actual substrate S twice is inputted into the light receiver 19. Therefore, there are few factors to cause an error, and measurement with higher accuracy can be expected.

FIG. 5 are graphs illustrating a relationship between the substrate angle and the measurement light intensity and illustrate measurement results of the relationship between the inclination angle α of the actual substrate S and the light amount of the reflection light, in which FIG. 5A is a measurement result of the inclination angle α of −6 to +6°, and FIG. 5B is a graph illustrating the result of FIG. 5A in an enlarged manner for the inclination angle α=+3 to +5.5°. The light amounts in FIG. 5 use data measured in a state in which the actual substrate S is not mounted as a reference.

As obvious from FIG. 5A, at the inclination angle a of the actual substrate S=0°, the light amount of the reflection light becomes the maximum value. That is because, as described in FIG. 4A, the light beam reflected on the front and back faces of the actual substrate S is also included.

If the angle of the actual substrate S is inclined, the light beam reflected on the surface of the actual substrate S is reflected in the direction according to the inclination of the actual substrate S, and the light amount measured by the light receiver 19 decreases along with the inclination angle of the actual substrate S. In a region with the inclination angle of approximately 4.5° or more, the light amount shows a substantially constant value. That is because, as described in FIG. 4B, the light reflected on the front and back faces of the actual substrate S is no longer taken into the light receiver 19.

Since it is known from FIG. 5B that a constant value is shown at the inclination angle of approximately 4.5° or more, it is preferable that the inclination angle of the actual substrate S is set at 4.5° or more. Here, since the similar effect is obtained in whatever direction the actual substrate S is inclined, the inclination angle is an absolute value of the angle with respect to the surface orthogonal to the optical axis of the measurement light.

That is, the inclination angle of the actual substrate S is preferably set to ±4.5° or more.

Also, the inclination angle of the actual substrate S is preferably the minimum within a range in which the light amount shows a constant value. Here, according to FIG. 5B, though slight inclination is found in the light amount change at the inclination angle of approximately 4.5°, the change in the light amount is no longer found at the inclination angle=5° or more.

Also, the inclination angle of the actual substrate S is a value changing in accordance with the distance between the actual substrate S and the reflection mirror 17 or between the actual substrate S and the spherical achromatic lens 15 or the optical fiber end portion 14. For example, if the distance between the actual substrate S and the spherical achromatic lens 15 or the optical fiber end portion 14 becomes longer, the allowable inclination angle of the actual substrate S becomes a small value.

As described above, in the thin film forming apparatus 1, the distance between the reflection mirror 17 and the spherical achromatic lens 15 is approximately 60 to 350 mm.

FIGS. 6 to 8 are measurement examples by the optical film thickness meter of the present invention, and they illustrate the result of measurement of the actual substrate S (BK-7 substrate) and the optical filter F by the optical film thickness meter in comparison with the measurement result of one transmission. In all the examples described below, measurement was made with the inclination angle of the actual measured substrate S=5°.

EXAMPLE 1

FIG. 6 is a graph illustrating a transmissivity measurement result of a BK-7 substrate. The X-axis indicates a measurement wavelength and the Y-axis indicates the light amount (transmissivity). FIG. 6 illustrates a transmissivity measurement result of two transmissions by the optical film thickness meter according to the present invention, a transmissivity measurement result of one transmission by a spectrophotometer SolidSpec3700 (by Shimadzu Corporation), and a converted value obtained by converting the data of one-transmission measurement to two-transmission measurement.

As obvious from FIG. 6, the BK-7 substrate has substantially flat transmissivity characteristics (optical characteristics) over the entire measured wavelength regions and the measured value of two-transmission and the converted value obtained by converting the one-transmission to the two-transmission show substantially the same value over the entire wavelength regions. This illustrates that with a simple configuration in which the reflection mirror 17 is arranged in the vacuum container 31, the optical film thickness meter according to the present invention has a large change amount with respect to the 100% light amount, that is, the control accuracy of the film thickness measurement can be improved.

EXAMPLE 2

FIG. 7 is a graph illustrating a transmissivity measurement result of an IR cut filter. The IR (infrared) cut filter is an optical filter F in which $Nb_2O_5/SiO_2$ is laminated on the BK-7 substrate. In FIG. 7, similarly to FIG. 6, the X-axis and the Y-axis also indicate the measurement wavelength and transmissivity, respectively, and the measurement result (two-transmission) by the optical film thickness meter according to the present invention, the measurement (one-transmission) by the spectrophotometer, and a value (converted value) obtained by converting the one-transmission data to the two-transmission one are shown.

According to FIG. 7, regarding the IR cut filter, the transmissivity in the infrared wavelength region at approximately 700 nm or more shows a value in the vicinity of 0%. In this measurement by the IR cur filter, the measured value of the two-transmission and the converted value obtained by converting the one-transmission to two-transmission also show substantially the same value over the entire wavelength region. Therefore, in the measurement with the IR cut filter, too, the optical film thickness meter according to the present invention can be considered to have measurement accuracy at least equal to the prior-art one-transmission optical film meter.

FIG. 8 compares the characteristics of the optical film thickness meter of the present invention with the prior-art measurement method and compares the calculation result by the optical film thickness meter according to the present invention and the calculation result by the prior-art one-transmission. For the calculation (simulation), optical calculation theory software sold in the market is used.

EXAMPLE 3

FIG. 8 is a graph illustrating a change in the light amount in the optical film thickness at the wavelength of 520 nm by elapsed time when a $SiO_2$ single-layer film is formed, which shows a calculation result of a change in the light amount of the $SiO_2$ single-layer film filter, and compares the one-transmission calculation result with the two-transmission calculation result of the $SiO_2$ single-layer film filter by the optical film thickness meter according to the present invention. The $SiO_2$ single-layer film filter is an optical filter F in which a $SiO_2$ single-layer film is formed on BK-7. The X-axis indicates the film forming time (in proportion to the film thickness) and the Y-axis indicates the transmission light amount. Also, the light-amount change calculation is a value at the wavelength of 520 nm.

As illustrated in FIG. 8, regarding the two-transmission calculated value by the optical film thickness meter according to the present invention (two transmission) and the one-transmission calculated value (one transmission), the change amount in the two-transmission in the present invention is bigger both in the transmissivity and transmission light amount, and measurement accuracy is improved more than the prior-art example by this increased change amount.

In FIG. 8, by comparing the calculation result of the measured value by the optical film thickness meter according to the present invention and the calculation result of the measured value by one transmission, it is shown that the change rate in the measurement by the optical film thickness meter of the present invention is higher. A difference in the change amounts is approximately 1.6 to 1.8 times. This is because the change amount becomes bigger by reduction in the transmissivity caused by two transmissions through the actual substrate S. Since the change amount in the measured value is large, measurement accuracy can be improved, and the optical film thickness meter according to the present invention can be considered to have measurement accuracy more excellent than the prior-art one-transmission optical film thickness meter.

The invention claimed is:

1. An optical film thickness meter which measures an optical film thickness by allowing measurement light to pass through an actual substrate, comprising:
   a light projector which emits outgoing light as the measurement light toward the actual substrate;
   a reflection mirror which reflects the outgoing light at a position on a side opposite to the light projector relative to the actual substrate;
   a light receiver which receives the measurement light which passes through the actual substrate, is reflected by the reflection mirror, and passes through the actual substrate; and
   a light detector which detects the measurement light received by the light receiver, wherein the actual substrate is disposed between the reflection minor and the light projector so that a perpendicular line to a film formation surface of the actual substrate has a predetermined angle with respect to an optical axis of the measurement light so that the light receiver receives the measurement light having passed through a first path of the actual substrate, reflected by the reflection mirror and then having passed through a second path of the actual substrate a second time, wherein at least one spot on the actual substrate in the first path is the same as at least one spot on the actual substrate of the second path.

2. The optical film thickness meter according to claim 1, wherein
   the reflection mirror has a reflection surface formed substantially in a perpendicular direction to the optical axis of the measurement light.

3. The optical film thickness meter according to claim 2, wherein
   the reflection mirror is disposed so that an angle formed by a perpendicular line to the reflection surface of the reflection mirror and the optical axis of the measurement light is within a range of −5.0° to +5.0°.

4. The optical film thickness meter according to claim 1, wherein
   the predetermined angle with respect to an optical axis of the measurement light is at least 4.5°.

5. The optical film thickness meter according to claim 1, wherein
the actual substrate moves at a predetermined speed, and the reflection mirror is disposed in a fixed manner at a given position with respect to the actual substrate.

6. A thin film forming apparatus, comprising:
a dome-shaped substrate holder which holds an actual substrate within a vacuum container and is rotatable;
a correcting plate disposed in a fixed manner on a vacuum container side at a position between a deposition device which vaporizes a deposition material and the substrate holder; and
an optical film thickness meter which measures an optical film thickness by allowing measurement light to pass through the actual substrate in a state in which the actual substrate is mounted on the substrate holder, wherein
the optical film thickness meter includes:
a light projector which emits outgoing light as the measurement light toward the actual substrate;
a reflection mirror which reflects the outgoing light at a position on a side opposite to the light projector relative to the actual substrate;
a light receiver which receives the measurement light which passes through the actual substrate, is reflected by the reflection mirror, and passes through the actual substrate; and
a light detector which detects the measurement light received by the light receiver, wherein
the actual substrate is disposed with inclination with respect to an optical system comprised of the light projector and the reflection mirror.

7. The thin film forming apparatus according to claim 6, wherein the reflection mirror is disposed on the correcting plate.

8. The optical film thickness meter according to claim 1, wherein
the actual substrate moves at a predetermined speed, and the reflection mirror is disposed in a fixed manner at a given position with respect to the actual substrate.

9. The optical film thickness meter according to claim 2, wherein
the actual substrate moves at a predetermined speed, and the reflection mirror is disposed in a fixed manner at a given position with respect to the actual substrate.

10. The optical film thickness meter according to claim 3, wherein
the actual substrate moves at a predetermined speed, and the reflection mirror is disposed in a fixed manner at a given position with respect to the actual substrate.

11. The optical film thickness meter according to claim 4, wherein
the actual substrate moves at a predetermined speed, and the reflection mirror is disposed n a fixed manner at a given position with respect to the actual substrate.

* * * * *